(12) United States Patent
Kim

(10) Patent No.: US 9,263,417 B2
(45) Date of Patent: Feb. 16, 2016

(54) SEMICONDUCTOR PACKAGES INCLUDING A MULTI-LAYERED DIELECTRIC LAYER AND METHODS OF MANUFACTURING THE SAME

(71) Applicant: SK hynix Inc., Icheon-si Gyeonggi-do (KR)

(72) Inventor: Seung Jee Kim, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/617,532

(22) Filed: Feb. 9, 2015

(65) Prior Publication Data

US 2015/0155262 A1     Jun. 4, 2015

Related U.S. Application Data

(62) Division of application No. 13/615,439, filed on Sep. 13, 2012, now Pat. No. 8,987,900.

(30) Foreign Application Priority Data

Jun. 13, 2012 (KR) .................. 10-2012-0063203

(51) Int. Cl.
    *H01L 21/56*       (2006.01)
    *H01L 23/00*       (2006.01)
    *H01L 23/29*       (2006.01)
    *H01L 23/31*       (2006.01)
    *H01L 21/768*     (2006.01)

(52) U.S. Cl.
 CPC .............. *H01L 24/83* (2013.01); *H01L 21/56* (2013.01); *H01L 21/568* (2013.01); *H01L 21/768* (2013.01); *H01L 23/295* (2013.01); *H01L 23/3128* (2013.01); *H01L 24/14* (2013.01); *H01L 24/13* (2013.01); *H01L 24/19* (2013.01); *H01L 2224/02371* (2013.01); *H01L 2224/0401* (2013.01); *H01L 2224/04105* (2013.01); *H01L 2224/131* (2013.01); *H01L 2224/13013* (2013.01); *H01L 2224/19* (2013.01); *H01L 2224/20* (2013.01); *H01L 2224/73267* (2013.01); *H01L 2224/83851* (2013.01); *H01L 2924/014* (2013.01); *H01L 2924/01322* (2013.01); *H01L 2924/12042* (2013.01); *H01L 2924/2064* (2013.01)

(58) Field of Classification Search
 CPC .............................. H01L 21/56; H01L 21/768
 USPC ...................................................... 438/126
 See application file for complete search history.

(56) References Cited

U.S. PATENT DOCUMENTS

| | | | |
|---|---|---|---|
| 6,525,429 B1 * | 2/2003 | Kovac | H01L 21/56 174/259 |
| 6,879,017 B2 * | 4/2005 | Ahn | H01L 21/7682 257/19 |
| 7,701,074 B2 * | 4/2010 | Condie | H01L 23/295 257/675 |

* cited by examiner

*Primary Examiner* — Tran Tran
(74) *Attorney, Agent, or Firm* — William Park & Associates Ltd.

(57) ABSTRACT

The embedded package includes a semiconductor chip having contact portions disposed on a top surface thereof, a first dielectric layer substantially surrounding sidewalls of the semiconductor chip and including first fillers dispersed therein, a second dielectric layer substantially covering the top surface of the semiconductor chip and including second fillers dispersed therein, and first external interconnection portions disposed on the second dielectric layer and electrically connected to the contact portions, wherein an average size of the first fillers is different from that of the second fillers.

9 Claims, 9 Drawing Sheets

SEMICONDUCTOR PACKAGES INCLUDING A MULTI-LAYERED DIELECTRIC LAYER AND METHODS OF MANUFACTURING THE SAME

CROSS-REFERENCE TO RELATED APPLICATION

The present application claims priority under 35 U.S.C. 119(a) to Korean Application No. 10-2012-0063203, filed on Jun. 13, 2012, in the Korean intellectual property Office, which is incorporated herein by reference in its entirety.

BACKGROUND

1. Technical Field

Embodiments of the present disclosure generally relate to electronic device packages, to embedded packages including a multi-layered dielectric layer, and methods of manufacturing the same.

2. Related Art

Electronic devices employed in electronic systems may include various circuit elements such as active elements and/or passive elements. The circuit elements may be integrated in and/or on a semiconductor substrate, thereby constituting the electronic device (also, referred to as a semiconductor chip or a semiconductor die). The electronic device may be mounted on a printed circuit board (PCB) or a package substrate to produce an electronic device package. The package substrate may include circuit interconnections such as silicon interposers. The electronic device package may be mounted on a main board to constitute the electronic systems, for example, computers, mobile systems, or data storage media.

The electronic devices may be buried in a substrate using device embedding technologies. According to the device embedding technologies, the electronic devices may be buried in a dielectric layer constituting the package substrate, and interconnections may be formed on a surface of the dielectric layer. As the semiconductor chips (or the electronic devices) become more highly integrated, sizes of the interconnections formed on the dielectric layer of the package substrate have been gradually reduced and connection structures electrically connecting the semiconductor chips to the interconnections have also been reduced. If the interconnections on the package substrate and the connection structures in the package substrate are reduced in size or dimension, the minimization of the interconnections and the connection structures may be more influenced by a surface roughness of the dielectric layer.

In the embedded packages fabricated using the device embedding technologies, the dielectric layer (or a dielectric film) may contain fillers to improve a mechanical characteristic and/or a thermal characteristic of the dielectric layer. The fillers may lower the coefficient of thermal expansion (CTE) of the dielectric layer and may be introduced into the dielectric layer to enhance the rigidity or the hardness of the dielectric layer. If the fillers are contained in the dielectric layer, the surface roughness of the dielectric layer may be affected by the fillers. Increase of the surface roughness of the dielectric layer may lead to a difficulty in scaling down the interconnections which are formed on the dielectric layer.

SUMMARY

Various embodiments are generally directed to embedded packages including a multi-layered dielectric layer and methods of manufacturing the same.

According to various embodiments, an embedded package includes a semiconductor chip having contact portions disposed on a top surface thereof, a first dielectric layer substantially surrounding sidewalls of the semiconductor chip and including first fillers dispersed therein, a second dielectric layer substantially covering the top surface of the semiconductor chip and including second fillers dispersed therein, and first external interconnection portions disposed on the second dielectric layer and electrically connected to the contact portions, wherein an average size of the first fillers is different from that of the second fillers.

In various embodiments, the average size of the second fillers may be less than 1 micrometer and the average size of the first fillers may be equal to or greater than 1 micrometer. Additionally, the average size of the second fillers may be within the range of about 0.1 micrometers to about 1 micrometer, and the average size of the first fillers may be within the range of about 1 micrometer to about 7 micrometers. Also, the average size of the second fillers may be within the range of about 0.3 micrometers to about 0.8 micrometers, and the average size of the first fillers may be within the range of about 1 micrometer to about 3 micrometers.

In various embodiments, the first dielectric layer may include an epoxy resin material or a polymer resin material in which the first fillers are dispersed, and the second dielectric layer may include an epoxy resin material or a polymer resin material in which the second fillers are dispersed.

In various embodiments, a weight content of the second fillers contained in the second dielectric layer may be less than that of the first fillers contained in the first dielectric layer. The second fillers may be dispersed in the second dielectric layer to have a content of about 0.1 wt % to about 10 wt %, and the first fillers may be dispersed in the first dielectric layer to have a content of about 60 wt % to about 85 wt %.

In various embodiments, the first dielectric layer may further include a reinforcing agent having one selected from the group consisting of glass fiber, woven fiber and carbon fiber.

In various embodiments, the embedded package may further include second external interconnection portions disposed on a bottom surface of the first dielectric layer substantially opposite to the second dielectric layer. The embedded package may still further include a via plug penetrating the first and second dielectric layers electrically connecting one of the second external interconnection portions to one of the first external interconnection portions.

In various embodiments, the semiconductor chip may include a memory chip or a logic chip.

In various embodiments, each of the contact portions may include a chip pad on the top surface of the semiconductor chip and a bump on a top surface of the chip pad substantially opposite to the semiconductor chip.

According to various embodiments, a method of manufacturing an embedded package includes providing a first dielectric layer including first fillers over a semiconductor chip and stacking a second dielectric layer including second fillers having a different average size from the first fillers on the first dielectric layer, laminating the first and second dielectric layers on the semiconductor chip to embed the semiconductor chip in the first dielectric layer, patterning the second dielectric layer to expose contact portions of the semiconductor chip, and forming first external interconnection portions electrically connected to the contact portions on the second dielectric layer.

In various embodiments, the second fillers may have an average size which is less than 1 micrometer and the first fillers may have an average size which is equal to or greater than 1 micrometer.

In various embodiments, the first dielectric layer may further include a reinforcing agent having one selected from the group consisting of glass fiber, woven fiber and carbon fiber.

In various embodiments, the method may further include forming a cavity in the first dielectric layer before the first and second dielectric layers are laminated on the semiconductor chip. The semiconductor chip may be inserted into the cavity during lamination of the first and second dielectric layers.

In various embodiments, the method may further include forming a first conductive layer on the second dielectric layer before the first and second dielectric layers are laminated on the semiconductor chip. The first conductive layer may act as a seed layer when the first external interconnection portions are formed.

In various embodiments, the method may further include mounting the semiconductor chip on a second conductive layer before the first and second dielectric layers are provided over the semiconductor chip. The second conductive layer may act as a seed layer when second external interconnection portions are formed on a bottom surface of the second conductive layer substantially opposite to the semiconductor chip.

In various embodiments, each of the contact portions may be formed to include a chip pad on a top surface of the semiconductor chip and a bump on a top surface of the chip pad substantially opposite to the semiconductor chip.

According to various embodiments, a method of manufacturing an embedded package includes sequentially stacking a first dielectric layer including first fillers and a second dielectric layer including second fillers that have a different average size from the first fillers, embedding a semiconductor chip in the first and second dielectric layers such that the first dielectric layer substantially surrounds sidewalls of the semiconductor chip and the second dielectric layer substantially covers a top surface of the semiconductor chip, and forming first external interconnection portions on the second dielectric layer. The first external interconnection portions are electrically connected to contact portions of the semiconductor chip.

In various embodiments, the method may further include forming a cavity in the first dielectric layer before the semiconductor chip is embedded in the first and second dielectric layers. The semiconductor chip may be inserted into the cavity when the semiconductor chip is embedded in the first and second dielectric layers.

BRIEF DESCRIPTION OF THE DRAWINGS

Embodiments of the inventive concept will become more apparent in view of the attached drawings and accompanying detailed description, in which.

DETAILED DESCRIPTION

Figure 1:
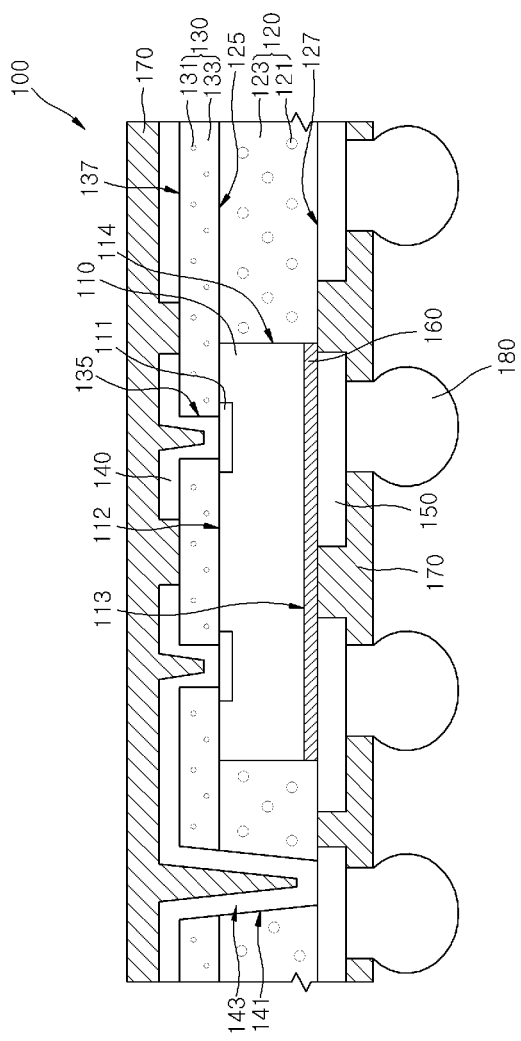
FIG. 1 is a cross sectional view illustrating an embedded package according to an embodiment.

Embedded packages according to various embodiments and methods of manufacturing the same will be described hereinafter with reference to the accompanying drawings.

It will be understood that although the terms first, second, third etc. may be used herein to describe various elements, these elements should not be limited by these terms. These terms are only used to distinguish one element from another element. Thus, a first element in various embodiments could be termed a second element in other embodiments without departing from the teachings of the inventive concepts. As used herein the term "and/or" includes any and all combinations of one or more of the associated listed items. Additionally, the same reference numerals or the same reference designators denote substantially the same elements throughout the specification.

It will be also understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the inventive concepts.

In addition, spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device (or a package) in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

It will be further understood that the term "semiconductor chip" used herein may correspond to a semiconductor die or a semiconductor substrate including a DRAM circuit or a flash memory circuit. Moreover, it will be understood that the term "contact portion" used herein may correspond to a conductive member for electrical connection, for example, an interconnection pad or a landing pad. In addition, the term "bump" used herein may correspond to an electrical connection member or a bonding member and may also be expressed as a stud or a post that is utilized in the art to which these embodiments belong.

FIG. 1 is a cross sectional view illustrating an embedded package according to an embodiment.

Referring to FIG. 1, an embedded package 100 according to an embodiment may include a semiconductor chip 110, and the semiconductor chip 110 may have a top surface 112 and contact portions 111 disposed on the top surface 112. The contact portions 111 may correspond to chip pads for electrically connecting the semiconductor chip 110 to an external device or an external system. The semiconductor chip 110 may include integrated circuits and the integrated circuits may be formed in and/or on active regions of the semiconductor chip 110.

When the active regions are located at the top surface 112 of the semiconductor chip 110, the contact portions 111 may be electrically connected to the integrated circuits disposed in and/or on the active regions. In such a case, the contact portions 111 may be electrically connected to the integrated circuits of the semiconductor chip 110 through redistributed lines (not illustrated). Alternatively, when the active regions are located at a bottom surface 113 of the semiconductor chip 110, the contact portions 111 on the top surface 112 may be electrically connected to the integrated circuits of the semiconductor chip 110 by through silicon vias (TSVs; not illustrated) vertically penetrating the semiconductor chip 110.

The semiconductor chip 110 may correspond to a memory chip or a logic chip. The memory chip may include, for example, a DRAM circuit or a flash memory circuit, and the logic chip may include, for example, a control circuit.

The embedded package 100 may further include a first dielectric layer 120 that substantially surrounds and protects a sidewall 114 of the semiconductor chip 110. The first dielectric layer 120 may include a first resin material 123 and first fillers 121 contained in the first resin material 123. The resin material 123 may have a layer form, a film form, or a sheet form due to the presence of the first fillers 121. The first fillers 121, for example, filling particles may be introduced into the first resin material 123 to enhance the rigidity or the hardness of the first resin material 123 used as a main material of the first dielectric layer 120 and/or to lower the coefficient of thermal expansion (CTE) of the first resin material 123 of the first dielectric layer 120. The first resin material 123 may include, for example, an epoxy resin material or a polymer resin material. The first dielectric layer 120 may substantially surround and contact the sidewall of the semiconductor chip 110, and no electrical connection members are disposed on the sidewall of the semiconductor chip 110. Thus, the surface roughness of the first dielectric layer 120 may not be considered. Therefore, various embodiments may allow the first fillers 121 to have relatively large sizes and/or relatively large content.

The first fillers 121 may include ceramic particles, and the ceramic particles may include, for example, metal oxide particles such as alumina particles or semiconductor oxide particles such as silica particles. The first fillers 121 may have relatively large sizes or relatively large diameters to lower the coefficient of thermal expansion (CTE) of the first dielectric layer 120. If the size of the first fillers 121 increases, the coefficient of thermal expansion (CTE) of the first dielectric layer 120 may be lowered and the rigidity or the hardness of the first dielectric layer 120 may be increased. Accordingly, increase of the size of the first fillers 121 may lead to improvement of mechanical stability and/or physical reliability of the first dielectric layer 120 or a package substrate (or a package body) including the first dielectric layer 120. In an embodiment, the first fillers 121 may include ceramic particles having an average size of about 1 micrometer or greater, and the first fillers 121 may be dispersed in the first dielectric layer 120. For example, the first fillers 121 may have an average size of about 1 micrometer to about 7 micrometers. Additionally, the first fillers 121 may have an average size of about 1 micrometer to about 2 micrometers, about 2 micrometers to about 3 micrometers, about 3 micrometers to about 5 micrometers, or about 5 micrometers to about 7 micrometers.

If the content of the first fillers 121 in the first dielectric layer 120 increases, the coefficient of thermal expansion (CTE) of the first dielectric layer 120 may be lowered and the rigidity or the hardness of the first dielectric layer 120 may be increased. In an embodiment, the first fillers 121 may be dispersed and contained in the first dielectric layer 120, and the content of the first fillers 121 in the first dielectric layer 120 may be within the range of about 60 wt % (i.e., weight percent) to about 85 wt %. Additionally, the first fillers 121 may be dispersed and contained in the first dielectric layer 120 to have the content of about 60 wt % to about 65 wt %, about 65 wt % to about 70 wt %, about 70 wt % to about 75 wt %, about 75 wt % to about 80 wt %, or about 80 wt % to about 85 wt %.

The embedded package 100 may further include a second dielectric layer 130 that substantially covers the top surface 112 of the semiconductor chip 110 and has first openings 135 exposing the contact portions 111. The second dielectric layer 130 may extend to substantially cover a top surface 125 of the first dielectric layer 120. First external interconnection portions 140 may be disposed on a top surface 137 of the second dielectric layer 130 substantially opposite to the semiconductor chip 110, and the first external interconnection portions 140 may extend to be electrically connected to the contact portions 111. The first external interconnection portions 140 may include a metal material, for example, a copper material. The first external interconnection portions 140 may be formed to have small and fine sizes by patterning a conductive layer stacked on the second dielectric layer 130. Thus, the second dielectric layer 130 should have a relatively low surface roughness to successfully perform a patterning process for forming the first external interconnection portions 140 without any process failures. For example, the second dielectric layer 130 may have a surface roughness which is lower than that of the first dielectric layer 120. In addition, the second dielectric layer 130 may have a viscosity which is lower than that of the first dielectric layer 120. This may be for more readily performing a lamination process to embed the semiconductor chip 110 in the first and second dielectric layers 120 and 130, respectively. The second dielectric layer 130 may be thinner than the first dielectric layer 120.

The second dielectric layer 130 may include a second resin material 133 and second fillers 131 dispersed and contained in the second resin material 133. The second fillers 131 may have an average size which is less than that of the first fillers 121 contained in the first dielectric layer 120. The second resin material 133 may include, for example, an epoxy resin material or a polymer resin material. The second fillers 131 may include ceramic particles, for example, metal oxide particles or silica particles.

As described above, an average size of the second fillers 131 may be less than that of the first fillers 121. Thus, the second dielectric layer 130 may have a lower surface roughness than the first dielectric layer 120. In an embodiment, the second fillers 131 may include ceramic particles having an average size which is equal to or less than about 1 micrometer, and the second fillers 131 may be dispersed in the second dielectric layer 130. For example, the second fillers 131 may have an average size of about 0.1 micrometers to about 1 micrometer. Additionally, the second fillers 131 may have an average size of about 0.1 micrometers to about 0.3 micrometers, about 0.3 micrometers to about 0.5 micrometers, about 0.5 micrometers to about 0.8 micrometers, or about 0.8 micrometers to about 1.0 micrometer.

The content of the second fillers 131 contained in the second dielectric layer 130 may be less than that of the first fillers 121 contained in the first dielectric layer 120. Thus, the surface roughness of the second dielectric layer 130 may be lower than that of the first dielectric layer 120. In an embodiment, the second fillers 131 may be dispersed and contained in the second dielectric layer 130 to have a content of about 0.1 wt % to about 10 wt %. For example, the content of the second fillers 131 in the second dielectric layer 130 may be within the range of about 0.1 wt % to about 5 wt % or about 5 wt % to about 10 wt %.

The surface roughness of the top surface 137 of the second dielectric layer 130 may affect a patterning process for forming the first external interconnection portions 140 disposed on the top surface 137 of the second dielectric layer 130. According to an embodiment, the surface roughness of the second dielectric layer 130 may be lower than that of the first dielectric layer 120 because the average size and the content of the second fillers 131 are less than the average size and the content of the first fillers 121. Thus, the first external interconnection portions 140 may be formed to have relatively fine and/or small sizes.

The embedded package 100 may further include second external interconnection portions 150 disposed on a bottom surface 113 of the semiconductor chip 110 and/or on a bottom surface 127 of the first dielectric layer 120. The second external interconnection portions 150 may correspond to circuit interconnection patterns including a metal material such as a copper material. In an embodiment, an additional dielectric layer (not illustrated) having substantially the same or similar surface roughness as the second dielectric layer 130 may be disposed between the first dielectric layer 120 and the second external interconnection portions 150 to more readily perform a patterning process for minimizing the sizes of the second external interconnection portions 150. In another embodiment, an adhesion layer 160 may be attached to the bottom surface 113 of the semiconductor chip 110. In such a case, the adhesion layer 160 may be disposed between the second external interconnection portions 150 and the semiconductor chip 110.

At least one of the second external interconnection portions 150 may be electrically connected to at least one of the first external interconnection portions 140 through at least one via hole 141 that penetrates the first and second dielectric layers 120 and 130. In such a case, a via plug 143 may be disposed in the via hole 141 and the via plug 143 may electrically connect one of the second external interconnection portions 150 to one of the first external interconnection portions 140. The via plug 143 may substantially have a through bump shape penetrating the first and second dielectric layers 120 and 130. Alternatively, the second external interconnection portion 150 may extend into the via hole 141 to form the via plug 143, as illustrated in FIG. 1. Protection layers 170, for example, solder resist patterns may be disposed to substantially cover the first and second external interconnection portions 140 and 150. External connection terminals 180, for example, solder balls may penetrate one of the protection layers 170 to contact the second external interconnection portion 150 and may protrude from a bottom surface of the protection layer 170.

According to the above embodiments, the embedded package 100 may be realized using a stack structure of the first and second dielectric layers 120 and 130. However, the stack structure of the first and second dielectric layers 120 and 130 may also be employed in other packages which are different from the embedded package. For example, the stack structure including the first and second dielectric layers 120 and 130 may also be applicable to a package substrate such as a printed circuit board (PCB) on which a semiconductor chip is mounted.

Figure 2:
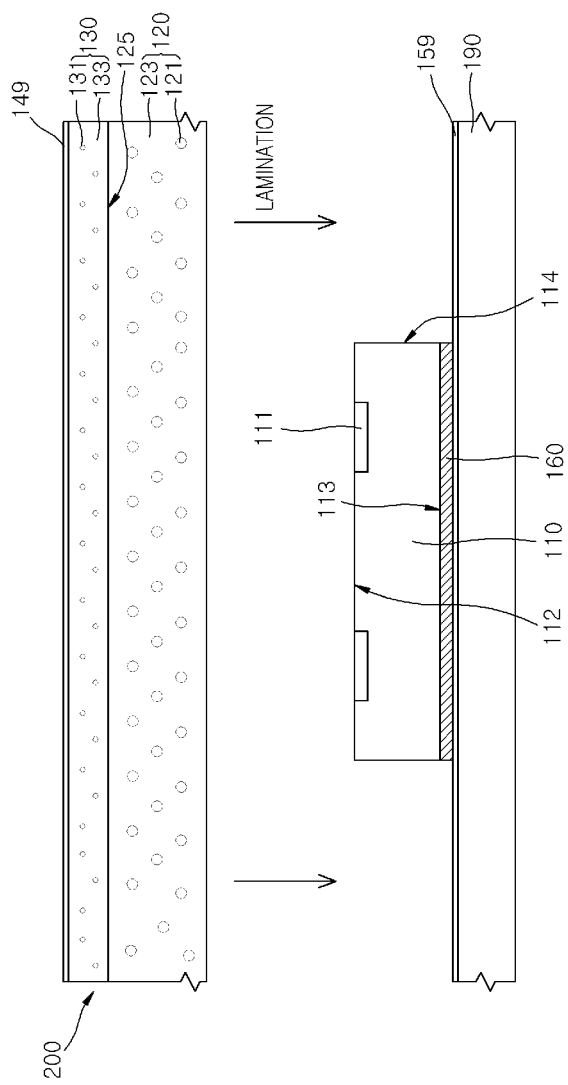
FIGS. 2 to 5 are cross sectional views illustrating a method of manufacturing an embedded package according to an embodiment.

FIGS. 2 to 5 are cross sectional views illustrating a method of manufacturing an embedded package according to an embodiment Referring to FIG. 2, a semiconductor chip 110 such as a semiconductor memory chip or a semiconductor logic chip may be mounted on a temporary substrate 190. A second conductive layer 159 may be formed on the temporary substrate 190, and the second conductive layer 159 may be, for example, a resin coated copper (RCC) layer or a copper clad laminate (CCL) layer. The temporary substrate 190 may be formed of an insulation material and may be used as a carrier substrate or a supporting substrate. The second conductive layer 159 may act as a seed layer when a conductive layer for forming second external interconnection portions (150 of FIG. 1) is grown to fabricate an embedded package (100 of FIG. 1) in a subsequent process. If the second external interconnection portions (150 of FIG. 1) are formed of a copper layer, the second conductive layer 159 may be formed by attaching a copper foil to the temporary substrate 190 or by depositing a copper material on the temporary substrate 190. The semiconductor chip 110 may be attached to the second conductive layer 159 using an adhesive layer 160. That is, the adhesive layer 160 may be disposed between a bottom surface 113 of the semiconductor chip 110 and a top surface of the second conductive layer 159. The semiconductor chip 110 may be formed to include contact portions 111 formed on a top surface 112 thereof. Thus, the contact portions 111 may be disposed on the semiconductor chip 110 substantially opposite to the temporary substrate 190.

A multi-layered dielectric film 200 may be provided over the semiconductor chip 110. In an embodiment, the multi-layered dielectric film 200 may include a first dielectric layer 120 and a second dielectric layer 130 which are sequentially stacked. The first dielectric layer 120 may include a first resin material 123 and first fillers 121 dispersed in the first resin material 123, and the second dielectric layer 130 may include a second resin material 133 and second fillers 131 dispersed in the second resin material 133. A first conductive layer 149 may be formed on a top surface of the second dielectric layer 130 substantially opposite to the first dielectric layer 120. The first conductive layer 149 may act as a seed layer when a conductive layer for forming first external interconnection portions (140 of FIG. 1) is grown to fabricate an embedded package (100 of FIG. 1) in a subsequent process. If the first external interconnection portions (140 of FIG. 1) are formed of a copper layer, the first conductive layer 149 may be formed by attaching a copper foil to the second dielectric layer 130 or by depositing a copper material on the second dielectric layer 130.

The multi-layered dielectric film 200 may be formed by stacking the second dielectric layer 130 on the first dielectric layer 120 with a lamination process, and the first conductive layer 149 such as a copper film may be then formed on the second dielectric layer 130 using a lamination process. Subsequently, the multi-layered dielectric film 200 and the first conductive layer 149 may be laminated on the temporary substrate 190 using, for example, pressure and heat, thereby embedding the semiconductor chip 110 in the first and second dielectric layers 120 and 130. Alternatively, the first and second dielectric layers 120 and 130 and the first conductive layer 149 may be sequentially stacked on and substantially aligned with the semiconductor chip 110 without any lamination, and the first and second dielectric layers 120 and 130 and the first conductive layer 149 may be substantially simultaneously or simultaneously laminated on the temporary substrate 190 using, for example, pressure and heat to embed the semiconductor chip 110 in the first and second dielectric layers 120 and 130.

Figure 3:
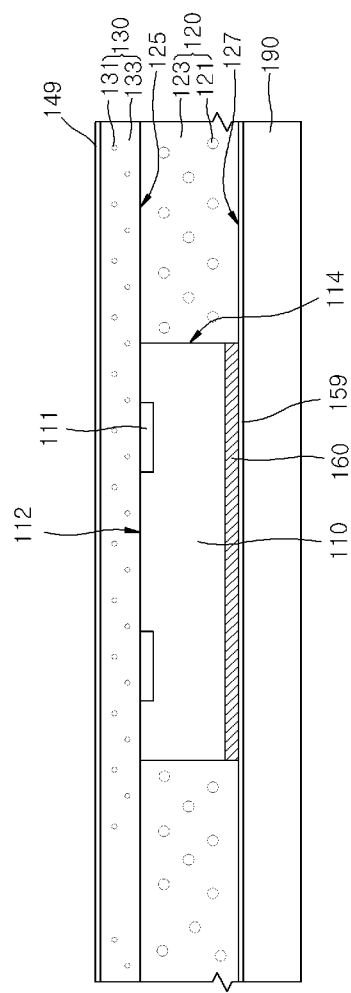

As described above, the second dielectric layer 130 may be laminated on the first dielectric layer 120, and the first dielectric layer 120 may be laminated to substantially surround sidewalls 114 of the semiconductor chip 110, as illustrated in FIG. 3. The second dielectric layer 130 may be laminated to substantially cover the top surface 112 of the semiconductor chip 110.

Figure 4:
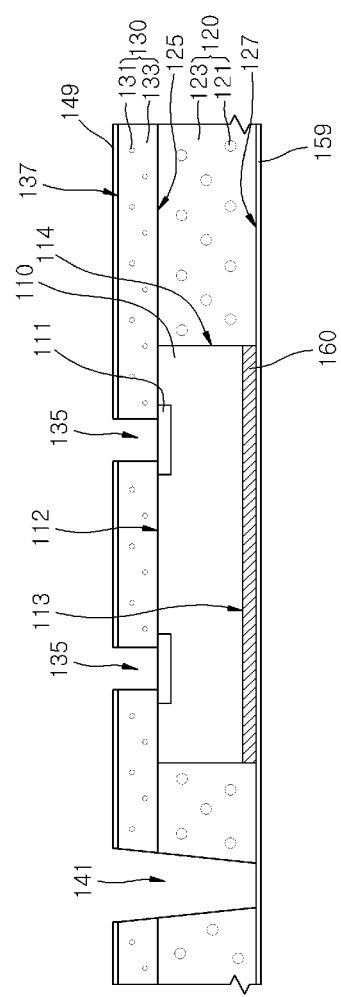

Referring to FIG. 4, the second dielectric layer 130 and the first dielectric layer 120 may be patterned to form first openings 135 that expose the contact portions 111 of the semiconductor chip 110. The first openings 135 may be formed using, for example, an etching process or a laser drilling process. In the event that the via plug 143 illustrated in FIG. 1 is required, a via hole 141 exposing a portion of the second conductive layer 159 may also be formed when the first openings 135 are formed. The via hole 141 may be formed to penetrate the first and second dielectric layers 120 and 130.

Figure 5:
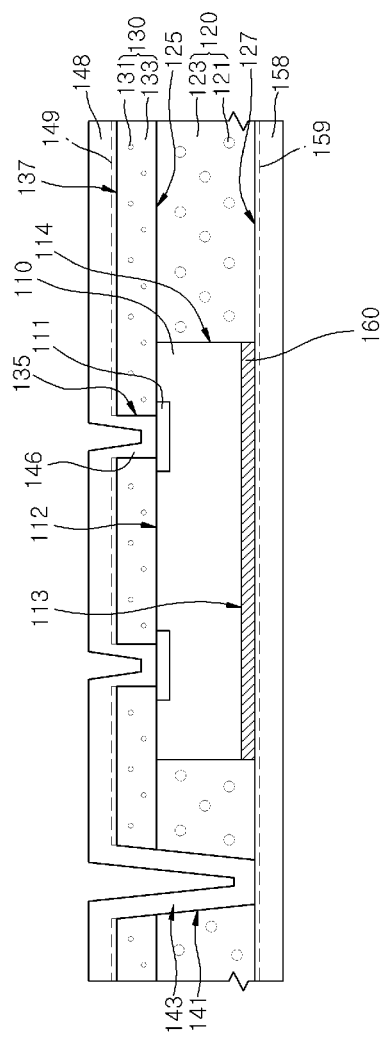

Referring to FIG. 5, a first external interconnection layer 148 and a second external interconnection layer 158 may be formed on a top surface 137 of the second dielectric layer 130 and a bottom surface 127 of the first dielectric layer 120, respectively. The first and second interconnection layers 148 and 158, respectively, may be formed using a plating process, and the plating process may be performed using the first and second conductive layers 149 and 159, respectively, as seed layers. The first and second interconnection layers 148 and 158, respectively, may be formed of, for example, a copper material. As a result of the plating process, connection portions 146 may be formed in respective ones of the first openings 135, and a via plug 143 may be formed in the via hole 141. The connection portions 146 may extend from the first external interconnection layer 148 to contact the contact portions 111, and the via plug 143 may extend from the first external interconnection layer 148 to contact the second external interconnection layer 158.

In various embodiments, the first and second conductive layers 149 and 159, respectively, may not be formed in the previous process steps. In such a case, a seed layer may be formed on the first and second dielectric layers 120 and 130, respectively, and in the first openings 135 and the via hole 141, and the first and second interconnection layers 148 and 158, respectively, may be formed on the seed layer using a plating process. Alternatively, when the first and second conductive layers 149 and 159, respectively, are not formed in the previous process steps, the first and second interconnection layers 148 and 158, respectively, may be formed using, for example, a sputtering process.

The first and second interconnection layers 148 and 158, respectively, may be patterned to form first external interconnection portions (140 of FIG. 1) on the second dielectric layer 130 and second external interconnection portions (150 of FIG. 1) on the second dielectric layer 130. Subsequently, protection layers (170 of FIG. 1) may be formed to substantially cover the first and second external interconnection portions (140 and 150 of FIG. 1), and external connection terminals (180 of FIG. 1) electrically connected to the second external interconnection portions (150 of FIG. 1) may be formed on a lower one of the protection layers (170 of FIG. 1).

FIGS. 6 to 9 are cross sectional views illustrating a method of manufacturing an embedded package according to an embodiment. In the previous and present embodiments, the same reference numerals or the same reference designators denote substantially the same elements. Thus, the explanations to the same elements as described in the previous embodiments will be omitted or briefly mentioned in the present embodiments.

Figure 6:
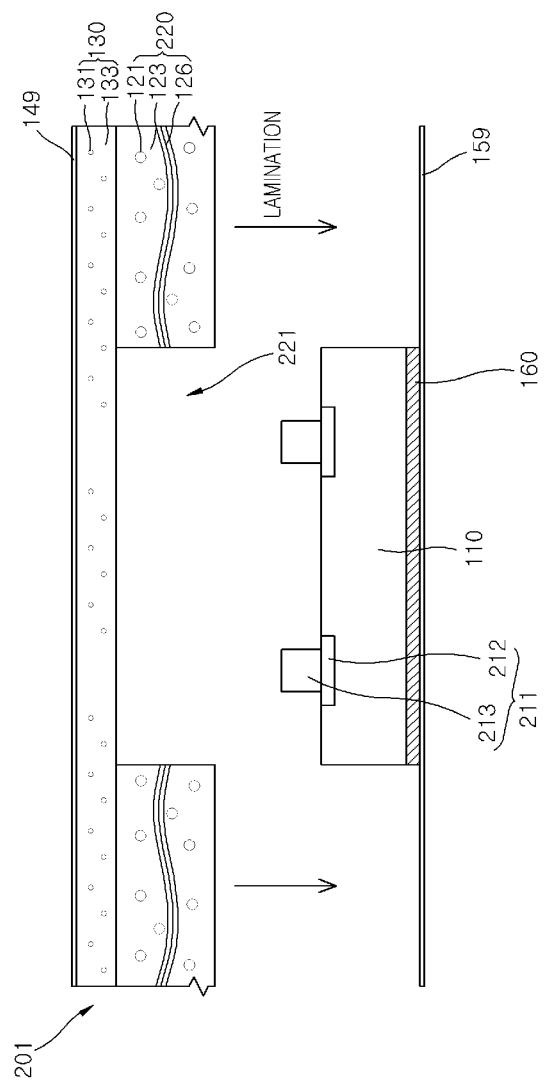
FIGS. 6 to 9 are cross sectional views illustrating a method of manufacturing an embedded package according to an embodiment.

Referring to FIG. 6, a semiconductor chip 110 may be attached to a second conductive layer 159 using an adhesive layer 160. That is, the adhesive layer 160 may be disposed between the semiconductor chip 110 and the second conductive layer 159. The semiconductor chip 110 may be formed to include contact portions 211 formed on a top surface thereof. Each of the contact portions 211 may be formed to include a chip pad 212 on the top surface of the semiconductor chip 110 and a bump 213 on the chip pad 212 substantially opposite to the semiconductor chip 110.

A multi-layered dielectric film 201 may be provided over the semiconductor chip 110. The multi-layered dielectric film 201 may include a first dielectric layer 220 and a second dielectric layer 130 which are sequentially stacked. The first dielectric layer 220 may include a first resin material 123 and first fillers 121 dispersed in the first resin material 123, and the second dielectric layer 130 may include a second resin material 133 and second fillers 131 dispersed in the second resin material 133.

The first dielectric layer 220 may further include a reinforcing agent 126 contained in the first resin material 123. For example, the first dielectric layer 220 may further include glass fiber, woven fiber, or carbon fiber as the reinforcing agent 126. The reinforcing agent 126 may be introduced into the first resin material 123 to lower the coefficient of thermal expansion (CTE) of the first dielectric layer 220 and to increase the hardness or the rigidity of the first dielectric layer 220.

A first conductive layer 149 may be formed on a top surface of the second dielectric layer 130 substantially opposite to the first dielectric layer 220. A cavity 221 in which the semiconductor chip 110 is inserted may be formed in the first dielectric layer 220. That is, the cavity 221 may provide a space in which the semiconductor chip 110 is embedded. The first and second dielectric layers 220 and 130 and the first conductive layer 149 may be provided in the form of a multi-layered film or in the form of separate layers which are substantially vertically aligned with each other.

Figure 7:
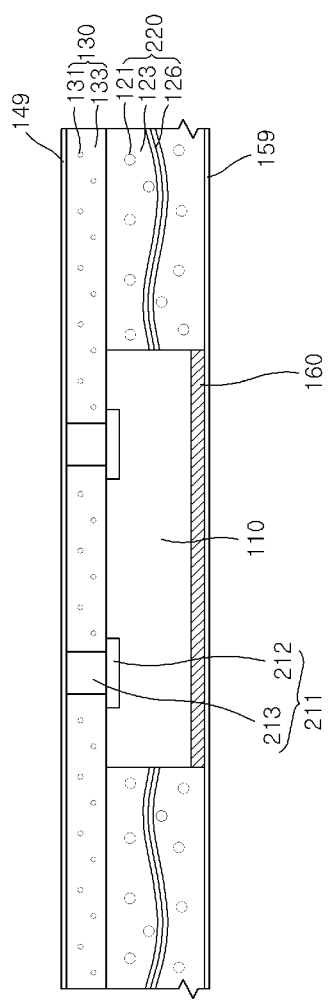

After the first and second dielectric layers 220 and 130, respectively, and the first conductive layer 149 are provided in the form of a multi-layered film or in the form of separate layers, the first and second dielectric layers 220 and 130, respectively, and the first conductive layer 149 may be laminated on the second conductive layer 159 using, for example, pressure and heat to embed the semiconductor chip 110 in the first dielectric layer 220. As a result of the lamination of the first and second dielectric layers 220 and 130 and the first conductive layer 149, the bumps 213 may penetrate the second dielectric layer 130 to contact the first conductive layer 149, as illustrated in FIG. 7. Since the bumps 213 penetrate the second dielectric layer 130 to contact the first conductive layer 149, a first external interconnection layer may be formed on the first conductive layer 149 in a subsequent process step without formation of deep holes like the first openings 135 of FIG. 4.

Figure 8:
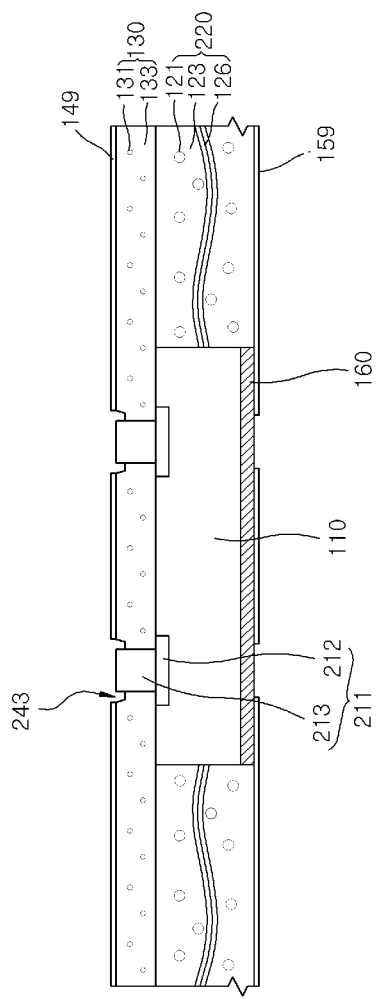

Referring to FIG. 8, the first conductive layer 149 may be patterned to form second openings 243 that expose the bumps 213. When the second openings 243 are formed, portions of the second dielectric layer 130 may also be etched to expose upper sidewalls of the bumps 213. The second openings 243 may be formed using, for example, a laser drilling process.

Figure 9:
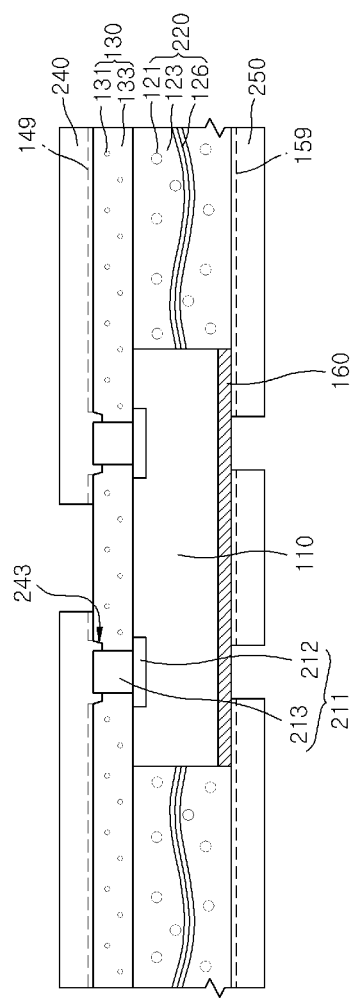

Referring to FIG. 9, a plating process may be performed using the first and second conductive layers 149 and 159, respectively, as seed layers, thereby forming a first external interconnection layer on the first conductive layer 149 and a second external interconnection layer on the second conductive layer 159. The first external interconnection layer may be patterned to form first external interconnection portions 240 electrically connected to the bumps 213, and the second external interconnection layer may be patterned to form second external interconnection portions 250 on bottom surfaces of the semiconductor chip 110 and the first dielectric layer 220. Subsequently, protection layers (170 of FIG. 1) and external connection terminals (180 of FIG. 1) may be formed using the same or similar manners as described in the previous embodiments.

According to the embodiments set forth above, external interconnection portions may be disposed on a multi-layered dielectric film including at least two different dielectric layers, for example, first and second dielectric layers which are sequentially stacked. The first dielectric layer may contain first fillers and the second dielectric layer may contain second fillers having an average size which is less than that of the first fillers. Thus, the second dielectric layer may have a lower surface roughness than the first dielectric layer. Accordingly, when the external interconnection portions are formed on a surface of the second dielectric layer, it may be possible to reduce the size or dimension of the external interconnection portions without process failures.

In addition, since the average size of the first fillers is greater than that of the second fillers, hardness or rigidity of the first dielectric layer may be higher than that of the second dielectric layer and a coefficient of thermal expansion (CTE) of the first dielectric layer may be less than that of the second dielectric layer. Thus, if a thickness of the first dielectric layer is relatively greater than that of the second dielectric layer, it can prevent or suppress the reliability of a package substrate (or a package body) including the first and second dielectric layers from being degraded.

The various embodiments of the inventive concept have been disclosed above for illustrative purposes. Those skilled in the art will appreciate that various modifications, additions, and substitutions are possible, without departing from the scope and spirit of the inventive concept as disclosed in the accompanying claims.

What is claimed is:

1. A method of manufacturing an embedded package, the method comprising:
    providing a first dielectric layer including first fillers over a semiconductor chip and stacking a second dielectric layer including second fillers having a different average size from the first fillers on the first dielectric layer;
    laminating the first and second dielectric layers on the semiconductor chip to embed the semiconductor chip in the first dielectric layer;
    patterning the second dielectric layer to expose contact portions of the semiconductor chip; and
    forming first external interconnection portions electrically connected to the contact portions on the second dielectric layer.

2. The method of claim 1, wherein the second fillers have an average size which is less than 1 micrometer and the first fillers have an average size which is equal to or greater than 1 micrometer.

3. The method of claim 1, wherein the first dielectric layer further includes a reinforcing agent having one selected from the group consisting of glass fiber, woven fiber, and carbon fiber.

4. The method of claim 1, further comprising forming a cavity in the first dielectric layer before the first and second dielectric layers are laminated on the semiconductor chip,
    wherein the semiconductor chip is inserted into the cavity during lamination of the first and second dielectric layers.

5. The method of claim 1, further comprising forming a first conductive layer on the second dielectric layer before the first and second dielectric layers are laminated on the semiconductor chip,
    wherein the first conductive layer acts as a seed layer when the first external interconnection portions are formed.

6. The method of claim 1, further comprising mounting the semiconductor chip on a second conductive layer before the first and second dielectric layers are provided over the semiconductor chip,
    wherein the second conductive layer acts as a seed layer when second external interconnection portions are formed on a bottom surface of the second conductive layer substantially opposite to the semiconductor chip.

7. The method of claim 1, wherein each of the contact portions is formed to include a chip pad on a top surface of the semiconductor chip and a bump on a top surface of the chip pad substantially opposite to the semiconductor chip.

8. A method of manufacturing an embedded package, the method comprising:
    sequentially stacking a first dielectric layer including first fillers and a second dielectric layer including second fillers that have a different average size from the first fillers;
    embedding a semiconductor chip in the first and second dielectric layers such that the first dielectric layer substantially surrounds sidewalls of the semiconductor chip and the second dielectric layer substantially covers a top surface of the semiconductor chip; and
    forming first external interconnection portions on the second dielectric layer,
    wherein the first external interconnection portions are electrically connected to contact portions of the semiconductor chip.

9. The method of claim 8, further comprising forming a cavity in the first dielectric layer before the semiconductor chip is embedded in the first and second dielectric layers,
    wherein the semiconductor chip is inserted into the cavity when the semiconductor chip is embedded in the first and second dielectric layers.

* * * * *